United States Patent
Shepard

(10) Patent No.: US 8,897,010 B2
(45) Date of Patent: Nov. 25, 2014

(54) HIGH PERFORMANCE LIQUID COOLED HEATSINK FOR IGBT MODULES

(75) Inventor: Mark Eugene Shepard, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 516 days.

(21) Appl. No.: 13/214,589

(22) Filed: Aug. 22, 2011

(65) Prior Publication Data

US 2013/0050944 A1  Feb. 28, 2013

(51) Int. Cl.
*H05K 7/20* (2006.01)
*H01L 23/473* (2006.01)
*F28F 7/00* (2006.01)
*H01L 23/34* (2006.01)

(52) U.S. Cl.
CPC .......... *H01L 23/473* (2013.01); *H05K 7/20936* (2013.01); *H05K 7/20218* (2013.01)
USPC ..... 361/699; 361/702; 165/80.4; 165/104.33; 257/714; 174/15.1

(58) Field of Classification Search
CPC ................. H01L 23/473–23/4735; F28F 3/12; F28F 3/02; F28F 2260/02; G06F 2200/201; H05K 1/0203; H05K 1/0272; H05K 7/20254; H05K 7/20927; H05K 7/20218–7/20281; H05K 7/2089–7/20945
USPC ................ 361/699, 702–703; 165/80.4–80.5, 165/104.33; 257/714, 716; 174/15.1
See application file for complete search history.

(56) References Cited

U.S. PATENT DOCUMENTS

| | | | |
|---|---|---|---|
| 5,388,635 A * | 2/1995 | Gruber et al. | 165/80.4 |
| 5,495,889 A * | 3/1996 | Dubelloy | 165/104.33 |
| 6,166,937 A | 12/2000 | Yamamura et al. | |
| 6,661,659 B2 | 12/2003 | Tamba et al. | |
| 6,817,405 B2 | 11/2004 | Kamath et al. | |
| 7,017,654 B2 * | 3/2006 | Kenny et al. | 165/80.4 |
| 7,106,589 B2 | 9/2006 | Kiley et al. | |
| 7,187,548 B2 * | 3/2007 | Meyer et al. | 361/699 |
| 7,710,723 B2 * | 5/2010 | Korich et al. | 361/699 |
| 8,464,781 B2 * | 6/2013 | Kenny et al. | 165/80.4 |
| 2005/0199371 A1 * | 9/2005 | Kemink et al. | 165/80.3 |
| 2005/0199373 A1 | 9/2005 | Godet et al. | |
| 2006/0002088 A1 * | 1/2006 | Bezama et al. | 361/702 |
| 2007/0202680 A1 * | 8/2007 | Ismail | 438/612 |
| 2007/0215325 A1 * | 9/2007 | Solovitz et al. | 165/80.4 |
| 2008/0266812 A1 * | 10/2008 | Steger et al. | 361/721 |
| 2009/0230544 A1 * | 9/2009 | Wang et al. | 257/712 |

* cited by examiner

*Primary Examiner* — Zachary M Pape

(74) *Attorney, Agent, or Firm* — James McGinness, Esq.; Armstrong Teasdale LLP

(57) ABSTRACT

A heat sink assembly includes a base plate coupled to a first side of an electronic device. A plurality of fins extend from the base plate and are positioned within a housing. The housing includes a first manifold defining a plurality of first passages and a second manifold defining a plurality of second passages in fluid communication with the plurality of first passages. At least one of the plurality of first passages extends between an adjacent pair of the plurality of second passages and is oriented to channel fluid toward at least one of the plurality of fins.

19 Claims, 3 Drawing Sheets

HIGH PERFORMANCE LIQUID COOLED HEATSINK FOR IGBT MODULES

BACKGROUND OF THE INVENTION

The subject matter described herein relates generally to cooling an object and, more specifically, to extracting heat from an insulated gate bipolar transistor (IGBT) module.

At least some known computer and/or electronic systems include at least one IGBT module for high-efficient, fast switching of electric power. During operation, known IGBT modules typically generate heat. As such, at least some known IGBT modules are coupled to a heat sink to dissipate heat generated by the IGBT module. At least some known systems have an IGBT module-heat sink interface with a high thermal resistance. For example, the interface may have micro-flatness issues and/or a lack of contact area due to low pressure.

With recent technological developments in computer and/or electronic systems, considerable efforts have been made to develop heat sinks that are reliable and efficient. At least some known systems include a thermal interface material (TIM), such as zinc oxide filled silicone grease, disposed between the IGBT module and the heat sink. However, a thin grease joint of the TIM may still account for 25-50% of a total temperature drop between the interface and the ambient environment.

BRIEF SUMMARY OF THE INVENTION

In one aspect, a housing is provided for use with a heat sink including a plurality of fins. The housing includes a first manifold defining a plurality of first passages, and a second manifold defining a plurality of second passages in fluid communication with the plurality of first passages. At least one of the plurality of first passages extends between an adjacent pair of the plurality of second passages and is oriented to channel fluid toward at least one of the plurality of fins. The plurality of fins are positioned within the housing.

In another aspect, a heat sink assembly is provided for use with an electronic device. The heat sink assembly includes a base plate coupled to a first side of the electronic device, a plurality of fins extending from the base plate, and a housing including a first manifold defining a plurality of first passages and a second manifold defining a plurality of second passages in fluid communication with the plurality of first passages. At least one of the plurality of first passages extends between an adjacent pair of the plurality of second passages and is oriented to channel fluid toward at least one of the plurality of fins. The plurality of fins are positioned within the housing.

In yet another aspect, a method is provided for cooling an electronic device coupled to a heat sink assembly including a base plate and a plurality of fins extending from the base plate. The method includes positioning the plurality of fins within a housing including a first manifold defining a plurality of first passages and a second manifold defining a plurality of second passages in fluid communication with the plurality of first passages. At least one of the plurality of first passages extends between an adjacent pair of the plurality of second passages. Fluid is channeled through at least one of the plurality of first passages, toward at least one of the plurality of fins, and through at least one of the second plurality of second passages.

The features, functions, and advantages that have been discussed can be achieved independently in various embodiments of the present invention or may be combined in yet other embodiments further details of which can be seen with reference to the following description and drawings.

DETAILED DESCRIPTION OF THE INVENTION

The methods and systems described herein relate to cooling an object. A heat sink assembly includes a base plate coupled to a first side of the object, a plurality of fins extending from the base plate, and a housing comprising a first manifold defining a plurality of first passages and a second manifold defining a plurality of second passages in fluid communication with the plurality of first passages. During operation, heat is transferred from the object, through the base plate, and to the fins. To cool the fins, fluid is channeled through at least one of the first passages, toward at least one of the fins, and through at least one of the second passages.

Figure 1:
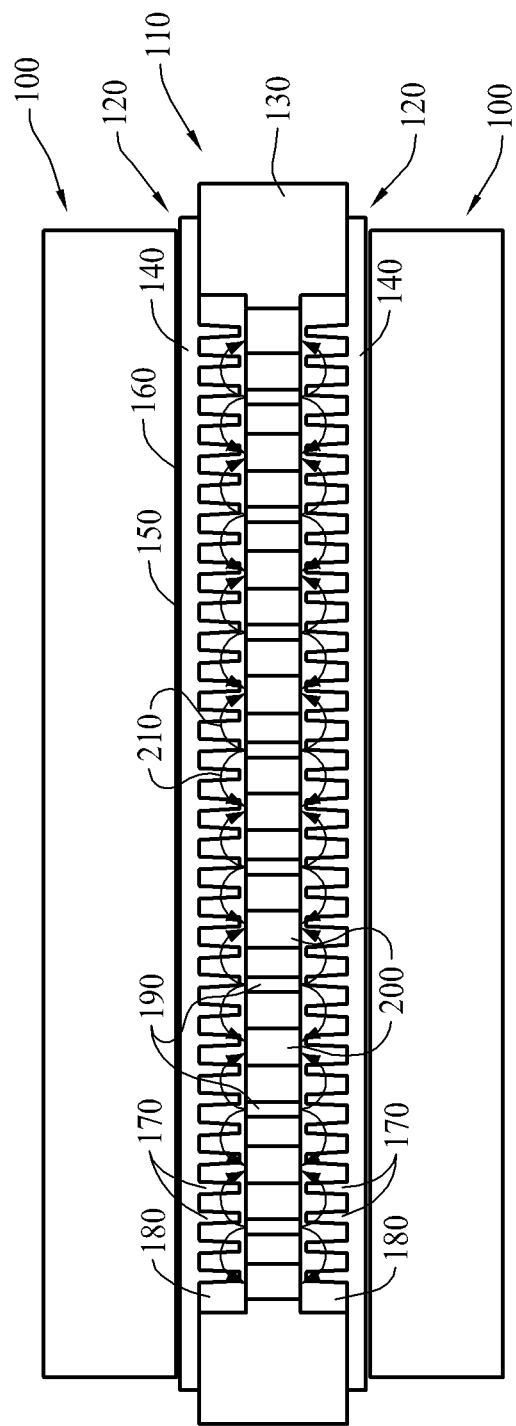
FIG. 1 is a side view of an exemplary electronic device coupled to an exemplary heat sink and an exemplary housing.

FIG. 1 shows an exemplary electronic device 100 coupled to a heat sink assembly 110 including an exemplary heat sink 120 and an exemplary housing 130. As used herein, the term "electronic device" refers to an object that affects electrons and/or their associated fields and generates heat as a by-product of its operation. Examples of electronic devices include, without limitation, an insulated gate bipolar transistor (IGBT) module, a semiconductor chip, a microprocessor, a digital signal processor, a graphics processing unit, an integrated circuit, a diode, and/or any other suitable heat-generating device. In the exemplary embodiment, electronic device 100 is a Mitsubishi CM2400HCB-34N IGBT, commercially available from Mitsubishi Electric Corporation of Tokyo Japan. Alternatively, electronic device 100 may be any object that enables heat sink 120 and/or housing 130 to function as described herein.

In the exemplary embodiment, a plurality of electronic devices 100 are coupled to heat sink assembly 110. More specifically, in the exemplary embodiment, heat sink assembly 110 is double-sided to enable two electronic devices 100 to be coupled thereto. Alternatively, any quantity of electronic devices 100 may be coupled to a heat sink assembly 110 having any quantity of sides that enables electronic device 100 and/or heat sink assembly 110 to function as described herein.

In the exemplary embodiment, heat sink 120 includes a base plate 140 that is coupled to electronic device 100 to absorb and/or dissipate heat generated by electronic device 100. Heat sink 120 is coupled to electronic device 100 using any suitable fastening mechanism that enables heat sink assembly 110 and/or electronic device 100 to function as described herein. For example, in the exemplary embodiment, base plate 140 and electronic device 100 each have a plurality of openings (not shown in FIG. 1), and a fastener (not shown) extends through each opening to couple electronic device 100 and/or base plate 140 to housing 130. Moreover, a thin solder interface is provided between base plate 140 and electronic device 100 to provide a thermal conductive material therebetween. In the exemplary embodiment, the thermal conductive material is a eutectic metal alloy. For example, in the exemplary embodiment, the eutectic metal alloy is used to solder base plate 140 to electronic device 100.

In the exemplary embodiment, use of the eutectic metal alloy enables base plate 140 and electronic device 100 to be intimately coupled to facilitate increasing a thermal conductivity therebetween. Alternatively, thermal conductive material may include any suitable material and/or composition that enables heat sink 120 and/or electronic device 100 to function as described herein.

To facilitate increasing thermal conductivity between base plate 140 and electronic device 100, in the exemplary embodiment, base plate 140 has a surface 150 that is substantially complementary to a surface 160 of electronic device 100. Additionally or alternatively, base plate 140 may be fabricated from a material having a high thermal conductivity such as, without limitation, aluminum, copper, aluminum silicon carbide, aluminum alloy, aluminum composite, copper alloy, copper composite, and/or graphite. In an alternative embodiment, heat sink assembly 110 does not include base plate 140, and fins 170 are coupled directly to electronic device surface 160.

In the exemplary embodiment, a plurality of fins 170 extend from base plate 140 to facilitate removing heat from electronic device 100. In the exemplary embodiment, each fin 170 is integrally formed with base plate 140. That is, in the exemplary embodiment, base plate 140 and fins 170 are fabricated from a single piece of metal, produced by extruding, casting, machining, and/or other metalworking process.

Additionally or alternatively, fin 170 may be soldered to base plate 140 at a temperature that is compatible with electronic device 100. That is, fins 170 may be coupled to base plate 140 without altering and/or damaging components (not shown) disposed within electronic device 100. For example, in such an embodiment, a eutectic metal bonding process is used to soft-solder fins 170 to base plate 140. The eutectic metal bond provides low thermal impedance between fin 170 and base plate 140. In the exemplary embodiment, the eutectic metal alloy has a melting temperature that is lower than a solder used in electronic device 100. In the exemplary embodiment, the eutectic metal alloy has a melting temperature that is lower than approximately 360° C. More particularly, in the exemplary embodiment, the eutectic metal alloy has a melting temperature that is lower than approximately 230° C. Even more particularly, in the exemplary embodiment, the eutectic metal alloy has a melting temperature lower than approximately 180° C.

TABLE 1

Properties of Exemplary Solder Alloys

| Solder Alloy | Element Ratio | Thermal Conductivity at 25° C. (W/(m · K)) | Melt Temperature (° C.) |
|---|---|---|---|
| AuSi | 97/3 | 27 | 363 |
| AuGe | 88/12 | 44 | 356 |
| AuSn | 80/20 | 57 | 280 |
| PbIn | 80/20 | 17 | 280 (liquid)/ 270 (solid) |
| SnCu | 99.3/0.7 | 65 | 227 |
| SnCuNi | N/A | 64 | 227 |
| SnAg | 96.5/3.5 | 78 | 221 |
| SnAgCu | 95.6/3.5/0.9 | ~60 | 217 Eutectic |
| SnAgCu | 95.5/3.8/0.7 | ~60 | ~217-220 |
| SnAgCuSb | 96.2/2.5/0.8/0.5 | 57 | 215-217 |
| PbIn | 50/50 | 22 | 209 (liquid)/ 180 (solid) |
| SnPb | 63/37 | 50 | 183 |
| BiSn | N/A | 19 | 138 |

In the exemplary embodiment, a solder alloy used to couple fins 170 to base plate 140 has a thermal conductivity between approximately 10.0 W/(m·K) and approximately 100.0 W/(m·K). Table 1 shows exemplary solder alloys that may be used to couple fins 170 to base plate 140. Alternatively, the eutectic metal alloy may be any suitable material and/or composition that enables heat sink 120 and/or electronic device 100 to function as described herein.

In the exemplary embodiment, fins 170 are fabricated from a material having a high thermal conductivity to facilitate increasing thermal conductivity between fins 170 and base plate 140. Such materials include, without limitation, aluminum, copper, aluminum alloy, aluminum composite, copper alloy, copper composite, and/or graphite. In one embodiment, at least one fin 170 is generally solid to facilitate increasing a thermal conductivity of fin 170. Additionally or alternatively, fins 170 may have a relatively large exterior surface area that is suitable to dissipate heat. For example, in the exemplary embodiment, each fin 170 is substantially cylindrical, conical, and/or frustoconical, has a length between approximately 0.5 cm (0.20 in.) and approximately 2.5 cm (0.98 in.), and has a diameter between approximately 1.0 mm (0.04 in.) and approximately 4.0 mm (0.16 in.). Alternatively, each fin 170 may have any size and/or shape that enables fin 170 to function as described herein.

In the exemplary embodiment, housing 130 is coupled to base plate 140 to define a cavity 180 therebetween. Housing 130 is coupled to base plate 140 using any suitable fastening mechanism that enables housing 130 and/or heat sink 120 to function as described herein. For example, in one embodiment, a collar extends about an outer periphery of housing 130 and/or base plate 140 to provide a seal that enables fluid to be retained within cavity 180. In another embodiment, housing 130 and heat sink 120 have a complementary groove and ridge system that enables a similar function. In such an embodiment, the groove and ridge system is disposed around an outer periphery and under surface of housing 130 and/or base plate 140 to provide a mating surface. A liquid seal such as, without limitation, an O-ring may be used with the collar and/or the groove and ridge system.

In the exemplary embodiment, cavity 180 is sized to receive fins 170. In the exemplary embodiment, housing 130 includes a first or an inlet manifold and a second or an outlet manifold, described in more detail below, that include a plurality of first or inlet passages 190 and a plurality of second or outlet passages 200, respectively. In the exemplary embodiment, inlet passages 190 are in fluid communication with outlet passages 200 by way of cavity 180. More specifically, in the exemplary embodiment, an arrangement of inlet and outlet passages 190 and 200, described in more detail below, enables a plurality of local flow paths 210 to be produced within cavity 180 to facilitate increasing heat transfer between pins 170 and fluid channeled through cavity 180. For example, in the exemplary embodiment, each inlet passage 190 is oriented to channel fluid toward an adjacent fin 170 and to an adjacent outlet passage 200.

During operation, in the exemplary embodiment, electronic device 100 generates heat, which is absorbed by heat sink assembly 110. Within heat sink assembly 110, heat transfers from base plate 140 to fins 170 to enable heat to be transferred away from electronic device 100.

In the exemplary embodiment, fluid is channeled from inlet passages 190 and toward base plate 140 and/or fins 170 to enable heat to be transferred from heat sink 120 or, more particularly, fins 170. Heat transfers from fins 170 to the fluid, which is channeled toward outlet passages 200. As such, heat sink assembly 110 produces local flow paths 210 that channel heat-transferred fluid away from fins 170 to reduce an amount of heat transferred between fins 170.

Figure 2:
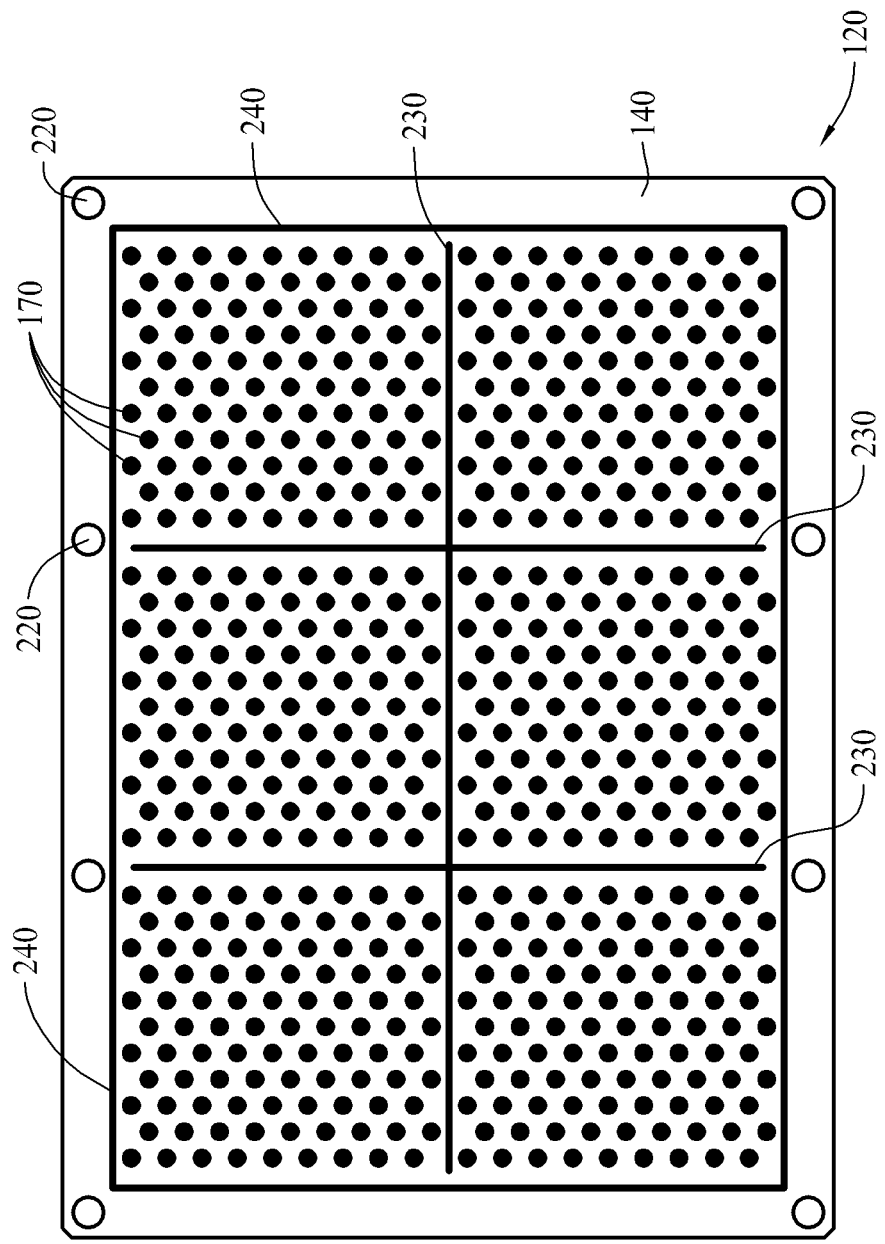
FIG. 2 is a top/bottom view of the heat sink shown in FIG. 1.

FIG. 2 shows heat sink 120 including fins 170 that are closely spaced to increase an aggregate surface area of fins 170 exposed to fluid channeled through cavity 180 (shown in FIG. 1). In the exemplary embodiment, fins 170 are arranged in an array and/or grid pattern. Alternatively, fins 170 may be arranged and/or oriented in any suitable configuration using an extrusion, casting, machining, and/or other metalworking process that enables heat sink 120 to function as described herein.

In the exemplary embodiment, a plurality of openings 220 extend through base plate 140. Openings 220 correspond to a plurality of openings (not shown) defined in electronic device 100. As such, a fastener (not shown) may be extended therethrough to enable electronic device 100 and/or base plate 140 to be coupled to housing 130.

Fluid exerts a static pressure within cavity 180, and, in the exemplary embodiment, a plurality of stiffening ribs 230 extend across a portion of base plate 140 to provide structural support to base plate 140. In the exemplary embodiment, stiffening ribs 230 provide flexural strength suitable to reduce deflection and/or deformation. In the exemplary embodiment, stiffening ribs 230 enable fluid to be channeled over fins 170. Moreover, in one embodiment, stiffening ribs 230 may be positioned and/or oriented to direct fluid through cavity 180 between inlet passages 190 (shown in FIG. 1) and outlet passages 200 (shown in FIG. 1).

In the exemplary embodiment, a seal 240 extends about an outer periphery of base plate 140. Seal 240 enables fluid to be retained within cavity 180. Alternatively, seal 240 may be positioned and/or oriented in any suitable configuration that enables heat sink 120 and/or housing 130 (shown in FIG. 1) to function as described herein.

Figure 3:
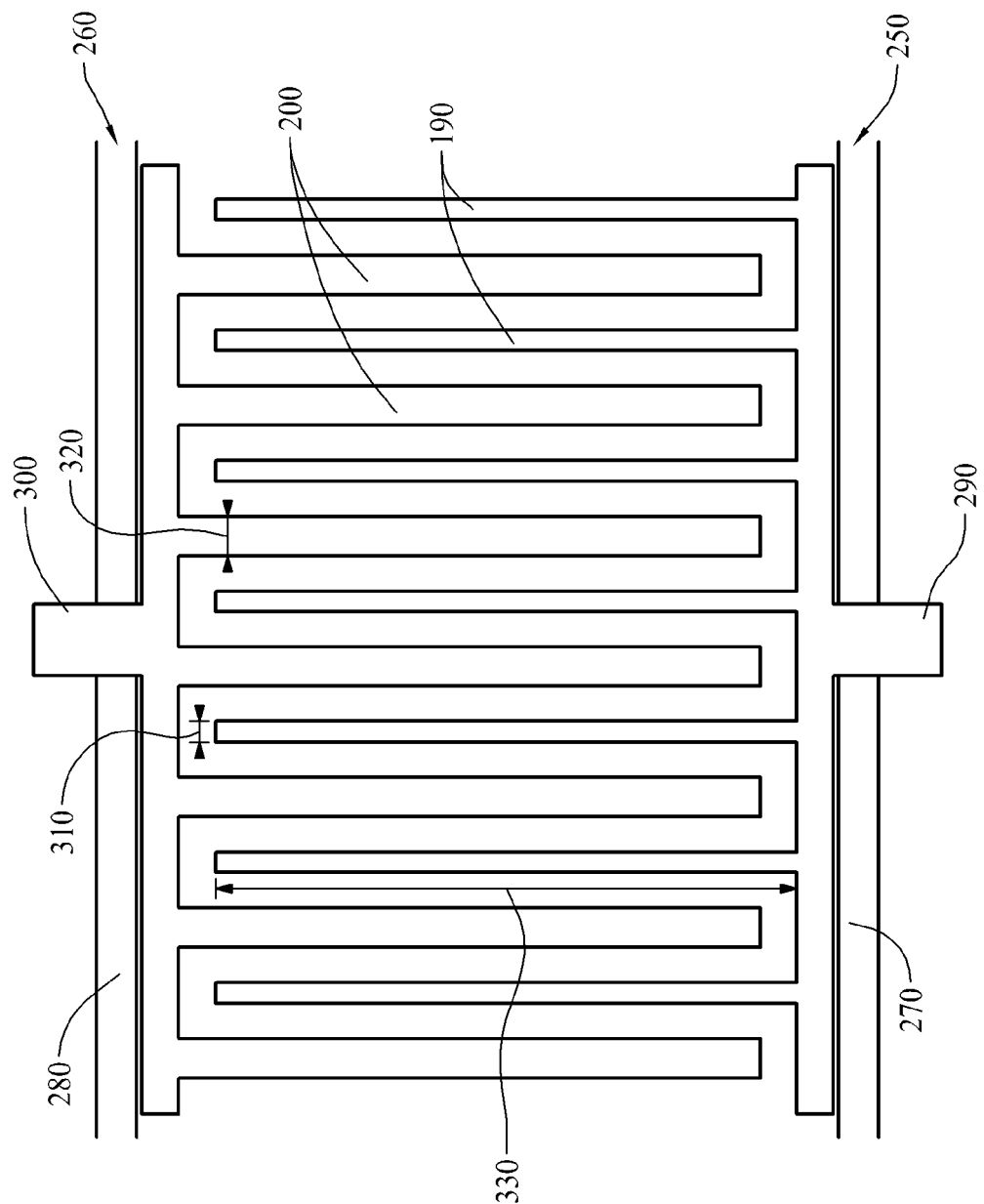
FIG. 3 is a schematic illustration of an exemplary arrangement of passages for the housing shown in FIG. 1.

FIG. 3 shows an arrangement of an inlet manifold 250 and an outlet manifold 260 disposed within housing 130 (shown in FIG. 1). In the exemplary embodiment, inlet manifold 250 is in fluid communication with inlet passages 190 extending from a first side wall 270 toward an opposing second side wall 280. In the exemplary embodiment, an inlet 290 is positioned and/or oriented to channel fluid through inlet passages 190.

Moreover, in the exemplary embodiment, outlet manifold 260 is in fluid communication with outlet passages 200 extending from second side wall 280 toward first side wall 270. In the exemplary embodiment, outlet passages 200 are positioned and/or oriented to channel fluid toward an outlet 300. More specifically, in the exemplary embodiment, at least one outlet passage 200 extends between an adjacent pair of inlet passages 190, and at least one inlet passage 190 extends between an adjacent pair of outlet passages 200. That is, in the exemplary embodiment, inlet passage 190 and outlet passages 200 are interleaved. In the exemplary embodiment, the interleaved arrangement of passages 190 and 200 facilitates channeling fluid through housing 130 such that heat transferred between fins 170 is substantially reduced as compared to conventional heat sinks. In the exemplary embodiment, inlet passages 190 and outlet passages 200 are aligned to be substantially parallel to each other.

In the exemplary embodiment, inlet manifold 250 is positioned and/or oriented to channel fluid toward outlet manifold 260. In one embodiment, fluid has a higher pressure at inlet 290 such that fluid is pushed through inlet passages 190, cavity 180, and/or outlet passages 200. Additionally, fluid is at a lower pressure at outlet 300 such that fluid is drawn from inlet passages 190, cavity 180, and/or outlet passages 200.

In the exemplary embodiment, a width 310 of inlet passage 190, which is less than a width 320 of outlet passage, is sized to enable fluid to be channeled substantially across a length 330 of inlet passages 190. Alternatively, in one embodiment, each inlet passage 190 may include a cover with a plurality of openings disposed along length 330. In such an embodiment, fluid channeled through inlet passage 190 may be directed through the openings to enable fins 170 to be cooled.

The methods and systems described herein relate to cooling an electronic component using a heat sink assembly. The heat sink assembly includes fins that are disposed within a housing. The housing includes at least one manifold that is configured to direct fluid in local flow paths to provide a high turbulence and/or cooling efficiency for the heat sink assembly. As such, the local flow paths facilitate increasing a transfer of heat between the fins and fluid channeled through a cavity. Moreover, the heat sink assembly is designed to have a large surface area in contact with fluid coolant and/or in intimate thermal contact with an electronic device base plate to facilitate yielding high performance.

Exemplary embodiments of cooling an electronic component are described above in detail. The methods and systems are not limited to the specific embodiments described herein, but rather, operations of the methods and components of the systems may be utilized independently and separately from other operations and/or components described herein. For example, the methods and apparatus described herein may have other industrial and/or consumer applications and are not limited to practice with electronic components as described herein. Rather, one or more embodiments may be implemented and utilized in connection with other industries.

As used herein, an element or step recited in the singular and preceded with the word "a" or "an" should be understood as not excluding plural said elements or steps, unless such exclusion is explicitly stated. Further, references to "one embodiment" are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A housing for use with a heat sink including a plurality of fins, said housing comprising:
   a first side wall, a second side wall, and a cavity defined therein;
   a first manifold defining a plurality of first passages positioned within said cavity and in open fluid communication with said cavity; and,
   a second manifold defining a plurality of second passages positioned within said cavity and in open fluid communication with the plurality of first passages through said cavity, at least one of the plurality of first passages extending between an adjacent pair of the plurality of second passages and oriented to channel fluid toward at least one of the plurality of fins, wherein the plurality of fins are positioned within said cavity.

2. A housing in accordance with claim 1, wherein the plurality of first passages and the plurality of second passages are oriented to provide a plurality of local flow paths within said cavity.

3. A housing in accordance with claim 1, wherein said first manifold is in fluid communication with an inlet and said second manifold is in fluid communication with an outlet such that fluid is channeled from the inlet through the plurality of first passages and is discharged from the plurality of second passages through the outlet.

4. A housing in accordance with claim 1, wherein the plurality of first passages extend from said first side wall toward said second side wall, and the plurality of second passages extend from said second side wall toward said first side wall.

5. A housing in accordance with claim 1, wherein the plurality of first passages are substantially parallel to the plurality of second passages.

6. A heat sink assembly for use with an electronic device, said heat sink assembly comprising:
   a base plate coupled to a first side of the electronic device;
   a plurality of fins extending from said base plate; and,
   a housing comprising:
     a first side wall, a second side wall, and a cavity defined therein;
     a first manifold defining a plurality of first passages positioned within said cavity and in open fluid communication with said cavity; and,
     a second manifold defining a plurality of second passages positioned within said cavity and in open fluid communication with the plurality of first passages through said cavity, at least one of the plurality of first passages extending between an adjacent pair of the plurality of second passages and oriented to channel fluid toward at least one of said plurality of fins, wherein said plurality of fins are positioned within said cavity.

7. A heat sink assembly in accordance with claim 6, further comprising a eutectic alloy disposed between said base plate and the first side of the electronic device.

8. A heat sink assembly in accordance with claim 6, wherein said plurality of fins are coupled to said base plate using a solder alloy having a thermal conductivity between approximately 10.0 W/(m·K) and approximately 100.0 W/(m·K).

9. A heat sink assembly in accordance with claim 6, wherein at least one of said plurality of fins is substantially solid.

10. A heat sink assembly in accordance with claim 6, wherein at least one of the plurality of first passages and the plurality of second passages are oriented to provide a plurality of local flow paths within said cavity.

11. A heat sink assembly in accordance with claim 6, wherein said first manifold is in fluid communication with an inlet and said second manifold is in fluid communication with an outlet such that fluid is channeled from the inlet through the plurality of first passages and is discharged from the plurality of second passages through the outlet.

12. A heat sink assembly in accordance with claim 6, wherein the plurality of first passages extend from said first side wall toward said second side wall, and the plurality of second passages extend from said second side wall toward said first side wall.

13. A heat sink assembly in accordance with claim 6, wherein the plurality of first passages are substantially parallel to the plurality of second passages.

14. A heat sink assembly in accordance with claim 6, wherein said base plate comprises a plurality of stiffening ribs.

15. A heat sink assembly in accordance with claim 6, further comprising a seal that facilitates retaining fluid within said housing.

16. A method for cooling an electronic device using a heat sink assembly, the heat sink assembly including a base plate and a plurality of fins extending from the base plate, the heat sink assembly further including a housing including a first side wall, a second side wall, and a cavity defined therein, the housing further including a first manifold defining a plurality of first passages positioned within the cavity and in open fluid communication with the cavity, and the housing further including a second manifold defining a plurality of second passages positioned within said cavity and in open fluid communication with the plurality of first passages through the cavity, said method comprising:
   positioning the plurality of fins within the housing;
   channeling fluid through at least one of the plurality of first passages into the cavity and toward at least one of the plurality of fins; and,
   channeling the fluid from the cavity through at least one of the plurality of second passages.

17. A method in accordance with claim 16, further comprising applying a eutectic alloy between the base plate and the electronic device.

18. A method in accordance with claim 16, wherein channeling fluid through at least one of the plurality of first passages into the cavity further comprises channeling fluid in a plurality of local flow paths within the cavity.

19. A method in accordance with claim 16, wherein channeling fluid further comprises:
   channeling fluid from an inlet through the plurality of first passages; and,
   discharging fluid from the plurality of second passages through an outlet.

* * * * *